(12) United States Patent
Kim et al.

(10) Patent No.: US 11,209,698 B2
(45) Date of Patent: Dec. 28, 2021

(54) DISPLAY DEVICE

(71) Applicant: Samsung Display Co., Ltd., Yongin-si (KR)

(72) Inventors: Bo Seong Kim, Chungcheongnam-do (KR); Duk-Hwan Kang, Cheonan-si (KR); Si Woong Lee, Cheonan-si (KR); Hyo Taek Lim, Asan-si (KR); Jae Jin Choi, Seongnam-si (KR); Heung-Sik Tae, Bucheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 70 days.

(21) Appl. No.: 16/502,314

(22) Filed: Jul. 3, 2019

(65) Prior Publication Data
US 2020/0124920 A1  Apr. 23, 2020

(30) Foreign Application Priority Data

Oct. 17, 2018 (KR) .................. 10-2018-0123909

(51) Int. Cl.
*G02F 1/13357* (2006.01)
*G02F 1/1335* (2006.01)
*H01L 33/50* (2010.01)
*G02F 1/1368* (2006.01)

(52) U.S. Cl.
CPC .. *G02F 1/133617* (2013.01); *G02F 1/133514* (2013.01); *H01L 33/502* (2013.01); *G02F 1/1368* (2013.01)

(58) Field of Classification Search
None
See application file for complete search history.

(56) References Cited

U.S. PATENT DOCUMENTS

| | | | | |
|---|---|---|---|---|
| 2014/0160408 | A1* | 6/2014 | Cho | G02F 1/133617 349/110 |
| 2016/0195773 | A1* | 7/2016 | Lee | G02F 1/133504 349/71 |
| 2018/0156951 | A1* | 6/2018 | Baek | G02F 1/133514 |
| 2018/0202616 | A1* | 7/2018 | Yoon | F21V 9/40 |

FOREIGN PATENT DOCUMENTS

| | | |
|---|---|---|
| KR | 1020120029096 A | 3/2012 |
| KR | 1020130005175 A | 1/2013 |
| KR | 1020150115080 A | 10/2015 |
| KR | 1020180019933 A | 2/2018 |
| KR | 1020180039218 A | 4/2018 |
| KR | 1020180040038 A | 4/2018 |

\* cited by examiner

*Primary Examiner* — Phu Vu
(74) *Attorney, Agent, or Firm* — Cantor Colburn LLP (57) ABSTRACT

A display device includes: a first pixel, a second pixel, and a third pixel from which lights of different colors are respectively emitted; in the first pixel, a first light conversion layer overlapping a first color filter; in the second pixel, a second light conversion layer overlapping a second color filter; and in the third pixel, a third light conversion layer overlapping a third color filter. The first light conversion layer, the second light conversion layer, and the third light conversion layer respectively include a quantum dot, and an amount of the quantum dot included in the first light conversion layer is larger than each of amounts of the quantum dot respectively included in the second light conversion layer and the third light conversion layer.

14 Claims, 8 Drawing Sheets

DISPLAY DEVICE

This application claims priority to Korean Patent Application No. 10-2018-0123909 filed on Oct. 17, 2018, and all the benefits accruing therefrom under 35 U.S.C. § 119, the entire contents of which are incorporated herein by reference.

BACKGROUND

(a) Field

The present disclosure relates to a display device.

(b) Description of the Related Art

A liquid crystal display is one of flat panel displays that are now widely used. The liquid crystal display includes two display panels in which field generating electrodes such as pixel electrodes and common electrodes are formed, and a liquid crystal layer interposed between the display panels. In the liquid crystal display, a voltage is applied to the field generating electrodes to generate an electric field in the liquid crystal layer, which determines the direction of liquid crystal molecules of the liquid crystal layer, and an image is displayed by controlling the polarization of incident light.

An emissive display device includes a light emitting layer interposed between two electrodes, one for injecting electrons and the other for injecting holes to the light emitting layer. The injected electrons and holes are coupled at the light emitting layer, and excitons are thereby formed. The formed excitons emit light while discharging energy. The emissive display device displays a predetermined image by using this emission of light.

Such a display device may cause a pixel stain or color differences relative to a design or structure of the display device.

SUMMARY

The exemplary embodiments provide a display device for which a pixel stain or a color difference is minimized or effectively prevented.

A display device includes: a first pixel, a second pixel, and a third pixel from which lights of different colors are respectively emitted; in the first pixel, a first light conversion layer overlapping a first color filter; in the second pixel, a second light conversion layer overlapping a second color filter; and in the third pixel, a third light conversion layer overlapping a third color filter. The first light conversion layer, the second light conversion layer, and the third light conversion layer respectively include a quantum dot provided in plurality, and an amount of the quantum dot included in the first light conversion layer is larger than each of amounts of the quantum dot respectively included in the second light conversion layer and the third light conversion layer.

A thickness of the first light conversion layer may be greater than each of a thickness of the second light conversion layer and a thickness of the third light conversion layer.

The amount of the quantum dot included in the second light conversion layer and the amount of the quantum dot included in the third light conversion layer may be the same.

The thicknesses of the second light conversion layer and the third light conversion layer may be the same.

Each of the first pixel, the second pixel, and the third pixel may include: a transistor; a pixel electrode connected to the transistor; a common electrode facing the pixel electrode; and a liquid crystal layer disposed between the pixel electrode and the common electrode.

Each of the first pixel, the second pixel, and the third pixel may include: a transistor; a light emitting diode ("LED") connected to the transistor; and an encapsulation layer on the light emitting diode ("LED").

A display device includes: a first pixel, a second pixel, and a third pixel from which lights of different colors are respectively emitted; in the first pixel, a first light conversion layer overlapping a first color filter; in the second pixel, a second light conversion layer overlapping a second color filter; and in the third pixel, a third light conversion layer overlapping a third color filter. The first light conversion layer, the second light conversion layer, and the third light conversion layer respectively include a quantum dot provided in plurality, and an amount of the quantum dot included in the first light conversion layer and an amount of the quantum dot included in the second light conversion layer are each larger than an amount of the quantum dot included in the third light conversion layer.

A thickness of the first light conversion layer and a thickness of the second light conversion layer may both be greater than a thickness of the third light conversion layer.

The amount of the quantum dot included in the first light conversion layer and the amount of the quantum dot included in the second light conversion layer may be the same.

The thicknesses of the first light conversion layer and the second light conversion layer may be the same.

Each of the first pixel, the second pixel, and the third pixel may include: a transistor; a pixel electrode connected to the transistor; a common electrode facing the pixel electrode; and a liquid crystal layer disposed between the pixel electrode and the common electrode.

Each of the first pixel, the second pixel, and the third pixel may include: a transistor; a light emitting diode connected to the transistor; and an encapsulation layer on the light emitting diode.

A display device includes: a first display panel including a transistor and an electrode which is connected to the transistor; a second display panel including a first color filter overlapping a first light conversion layer, a second color filter overlapping a second light conversion layer, and a third color filter overlapping a third light conversion layer. The first light conversion layer, the second light conversion layer, and the third light conversion layer respectively include a quantum dot provided in plurality, and an amount of the quantum dot included in the first light conversion layer is larger than an amount of the quantum dot included in the second light conversion layer or an amount of the quantum dot included in the third light conversion layer.

The amount of the quantum dot included in the first light conversion layer may be larger than each of the amount of the quantum dot included in the second light conversion layer and the amount of the quantum dot included in the third light conversion layer.

A thickness of the first light conversion layer may be greater than each of a thickness of the second light conversion layer and a thickness of the third light conversion layer.

The amount of the quantum dot included in the second light conversion layer and the amount of the quantum dot included in the third light conversion layer may be the same.

The thickness of the second light conversion layer and the thickness of the third light conversion layer may be the same.

The amount of the quantum dot included in the first light conversion layer and the amount of the quantum dot included in the second light conversion layer may be both larger than the amount of the quantum dot included in the third light conversion layer.

A thickness of the first light conversion layer and a thickness of the second light conversion layer may be both greater than a thickness of the third light conversion layer.

The amount of the quantum dot included in the first light conversion layer and the amount of the quantum dot included in the second light conversion layer may be the same. The thickness of the first light conversion layer and the thickness of the second light conversion layer may be the same.

The display device may further include a liquid crystal layer disposed between the first display panel and the second display panel.

The display device may further include a light emitting diode ("LED") connected to the transistor and including the electrode; an encapsulation layer disposed on the light emitting diode ("LED"); and the second display panel disposed on the encapsulation layer.

According to one or more exemplary embodiment, a pixel stain may be reduced or effectively prevented or a color difference may be minimized.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In describing the invention, parts that are not related to the description will be omitted. Like reference numerals generally designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, in this specification, the phrase "on a plane" means viewing a target portion from the top (e.g., in a top plan view), and the phrase "on a cross-section" means viewing a cross-section formed by vertically cutting a target portion from the side.

FIG. 1 to FIG. 8 are respectively enlarged cross-sectional views schematically showing exemplary embodiments of a display device. FIG. 1 to FIG. 4 may represent a non-emissive display device for which light is provided thereto from outside the illustrated structure. FIG. 5 to FIG. 8 may represent an emissive display device for which light is internally provided. For the non-emissive display device and the emissive display device, light may be used to display an image.

Figure 1:
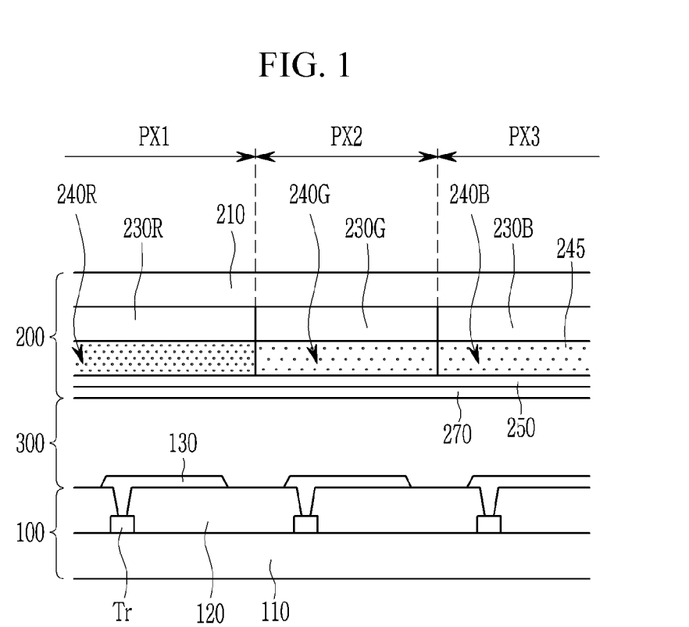
FIG. 1 to FIG. 8 are respectively enlarged cross-sectional views schematically showing exemplary embodiments of a display device.

Referring to FIG. 1, a display device includes a first pixel PX1, a second pixel PX2, and a third pixel PX3. The first pixel PX1, the second pixel PX2, and the third pixel PX3 represent different colors from each other. That is, different color light may be respectively emitted from the first pixel PX1, the second pixel PX2, and the third pixel PX3. In an exemplary embodiment, for example, the first pixel PX1 may represent red, the second pixel PX2 may represent green, and the third pixel PX3 may represent blue.

Also, the display device includes a first display panel 100, a second display panel 200, and a light control layer such as a liquid crystal layer 300. The liquid crystal layer 300 is disposed between the first display panel 100 and the second display panel 200. A light source (not shown) may provide light to the display device, and the display device may display an image with the light provided from the light source, without being limited thereto.

The display device and elements thereof may be disposed in a plane defined by first and second directions which cross each other. In FIG. 1, the horizontal direction may represent the first direction and/or the second direction. A thickness of the display device and elements thereof extends in a third direction which crosses each of the first and second directions. In FIG. 1, the vertical direction represents the third direction. The directions described above may be similarly applied to the various display devices shown in FIG. 1 to FIG. 8.

The first display panel 100 includes a first substrate 110, a transistor Tr, an insulating layer 120, and a pixel electrode 130. One or more of these elements may be provided in plural within the first display panel 100.

The first substrate 110 includes glass or plastic. The transistor Tr is disposed on the first substrate 110, and the insulating layer 120 is disposed on the transistor Tr and the first substrate 110. The pixel electrode 130 is disposed on the insulating layer 120 and is connected to the transistor Tr.

The first pixel PX1, the second pixel PX2, and the third pixel PX3 each include the transistor Tr, the pixel electrode 130, and a portion of the liquid crystal layer 300.

The second display panel 200 includes a second substrate 210, a red color filter 230R, a green color filter 230G, a blue color filter 230B, a red light conversion layer 240R, a green light conversion layer 240G, a blue light conversion layer 240B, a barrier layer 250, and a common electrode 270. The red color filter 230R, the green color filter 230G, the blue color filter 230B, the red light conversion layer 240R, the green light conversion layer 240G, the blue light conversion layer 240B, the barrier layer 250, and the common electrode 270 are disposed between the second substrate 210 and the first display panel 100. The common electrode 270 faces the pixel electrode 130 via the liquid crystal layer 300.

The first pixel PX1 may include the red color filter 230R and the red light conversion layer 240R, the second pixel PX2 may include the green color filter 230G and the green light conversion layer 240G, and the third pixel PX3 may include the blue color filter 230B and the blue light conversion layer 240B.

Also, each of the first pixel PX1, the second pixel PX2, and the third pixel PX3 include a portion of the barrier layer 250 and a portion of the common electrode 270. The barrier layer 250 and the common electrode 270 are commonly disposed with respect to each of the first pixel PX1, the second pixel PX2, and the third pixel PX3.

The second substrate 210 includes glass or plastic.

The red color filter 230R, the green color filter 230G, and the blue color filter 230B are disposed at a surface of the second substrate 210.

The red light conversion layer 240R, the green light conversion layer 240G, and the blue light conversion layer 240B are disposed at a surface of the red color filter 230R, the green color filter 230G, and the blue color filter 230B.

That is, along a thickness of the display device, such as in a top plan view of the display device, the red light conversion layer 240R overlaps the red color filter 230R, the green light conversion layer 240G overlaps the green color filter 230G, and the blue light conversion layer 240B overlaps the blue color filter 230B.

The red light conversion layer 240R converts light supplied from a light source (not shown) into red light to be emitted from the red light conversion layer 240R, and the green light conversion layer 240G converts light supplied from the light source (not shown) into green light to be emitted from the green light conversion layer 240G. The blue light conversion layer 240B converts light supplied from the light source (not shown) into blue light to be emitted from the blue light conversion layer 240B. The red light conversion layer 240R, the green light conversion layer 240G, and the blue light conversion layer 240B may together form a light conversion layer. The red light emitted from the red light conversion layer 240R, the green light emitted from the green light conversion layer 240G and the blue light emitted from the blue light conversion layer 240B may be respectively provided to the red color filter 230R, the green color filter 230G, and the blue color filter 230B to be incident thereto. That is, a light emission direction may be in a direction from the first display panel 100 to the second display panel 200, without being limited thereto.

The red light conversion layer 240R, the green light conversion layer 240G, and the blue light conversion layer 240B each include a plurality of a quantum dot 245. The quantum dot 245 may be selected from a Group II-VI compound, a Group III-V compound, a Group IV-VI compound, a Group IV element, a Group IV compound, and a combination thereof.

The Group II-VI compound may be selected from a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a combination thereof.

The Group IV-VI compound may be selected from a binary compound selected from SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; and a quaternary compound selected from SnPbSSe, SnPbSeTe, SnPbSTe, and a combination thereof. The Group IV element may be selected from Si, Ge, and a combination thereof. The Group IV compound may be a binary compound selected from SiC, SiGe, and a combination thereof.

The binary compound, the ternary compound, or the quaternary compound may exist in particles at a uniform concentration, or may exist as the same particle divided into states where concentration distributions partially differ. Further, the quantum dot may have a core/shell structure where one quantum dot surrounds another quantum dot. An interface between the core and the shell may have a concentration gradient, such that a concentration of an element existing in the shell is gradually reduced as a distance to the center thereof decreases.

The quantum dot 245 may have a full width at half maximum ("FWHM") of a light-emitting wavelength spectrum which is less than about 45 nanometers (nm), or more particularly about 40 nm or about 30 nm. In these ranges of the plurality of the quantum dot 245, the color purity and reproducibility of the display device may be improved.

In addition, shapes of the quantum dot 245 are not specifically limited to shapes that are generally used in the related art. In exemplary embodiments, a nanoparticle having a spherical, pyramidal, multi-arm, or cubic shape, a nanotube, a nanowire, a nanofiber, and a planar nanoparticle are used as the quantum dot 245.

Thicknesses of the red light conversion layer 240R, the green light conversion layer 240G, and the blue light conversion layer 240B may be the same, and an amount of the quantum dot 245 included in the red light conversion layer 240R, the green light conversion layer 240G, and the blue light conversion layer 240B may be different.

In an exemplary embodiment, for example, as shown in FIG. 1 by the dots within the red light conversion layer 240R, the green light conversion layer 240G, and the blue light conversion layer 240B, the amount of the quantum dot 245 included in the red light conversion layer 240R may be larger than each of the amount of the quantum dot 245 included in the green light conversion layer 240G and the amount of the quantum dot 245 included in the blue light conversion layer 240B. The amount of the quantum dot 245 included in the green light conversion layer 240G and the amount of the quantum dot 245 included in the blue light conversion layer 240B may be the same. Accordingly, a defect of the first pixel PX1 due to a defective red color filter 230R may be minimized by the red light conversion layer 240R. That is, the red light conversion layer 240R may reduce or effectively prevent color stain or smearing at the first pixel PX1 or minimize the color difference at the first pixel PX1.

Where FIG. 1 shows, the amount of the quantum dot 245 included in the red light conversion layer 240R may be larger than each of the amount of the quantum dot 245 included in the green light conversion layer 240G and the amount of the quantum dot 245 included in the blue light conversion layer 240B, a display device is not limited thereto. In an exemplary embodiment, the amount of the quantum dot 245 included in the green light conversion layer 240G may be larger than each of the amount of the quantum dot 245 included in the red light conversion layer 240R and the amount of the quantum dot 245 included in the blue light conversion layer 240B. That is, the smearing at the second pixel PX2 may be reduced or effectively prevented or the color difference at the second pixel PX2 may be minimized.

In an exemplary embodiment, the amount of the quantum dot 245 included in the blue light conversion layer 240B may be larger than each of the amount of the quantum dot 245 included in the red light conversion layer 240R and the amount of the quantum dot 245 included in the green light conversion layer 240G. That is, the smearing at the third pixel PX3 may be reduced or effectively prevented or the color difference at the third pixel PX3 may be minimized.

The larger amount of the quantum dot 245 described above for a respective light conversion layer among the red light conversion layer 240R, the green light conversion layer 240G, and the blue light conversion layer 240B, may be the maximum amount of the quantum dot 245 among the red light conversion layer 240R, the green light conversion layer 240G, and the blue light conversion layer 240B. In FIG. 1, one color pixel among the first pixel PX1, the second pixel PX2, and the third pixel PX3 may have the maximum amount of the quantum dot 245.

The red light conversion layer 240R, the green light conversion layer 240G, and the blue light conversion layer 240B may each further include a light scattering member. The light scattering member may include any material that can evenly scatter light incident thereto. In an exemplary embodiment, for example, the light scattering member may include one of $TiO_2$, $ZrO_2$, $Al_2O_3$, $In_2O_3$, ZnO, $SnO_2$, $Sb_2O_3$, and indium tin oxide ("ITO").

The barrier layer 250 is commonly disposed at a surface of each of the red light conversion layer 240R, the green light conversion layer 240G, and the blue light conversion layer 240B. The barrier layer 250 serves to protect the red light conversion layer 240R, the green light conversion layer 240G, and the blue light conversion layer 240B in the manufacturing process of the second display panel 200. The barrier layer 250 may include an inorganic material or an organic material.

The common electrode 270 is disposed at a surface of the barrier layer 250.

Figure 2:
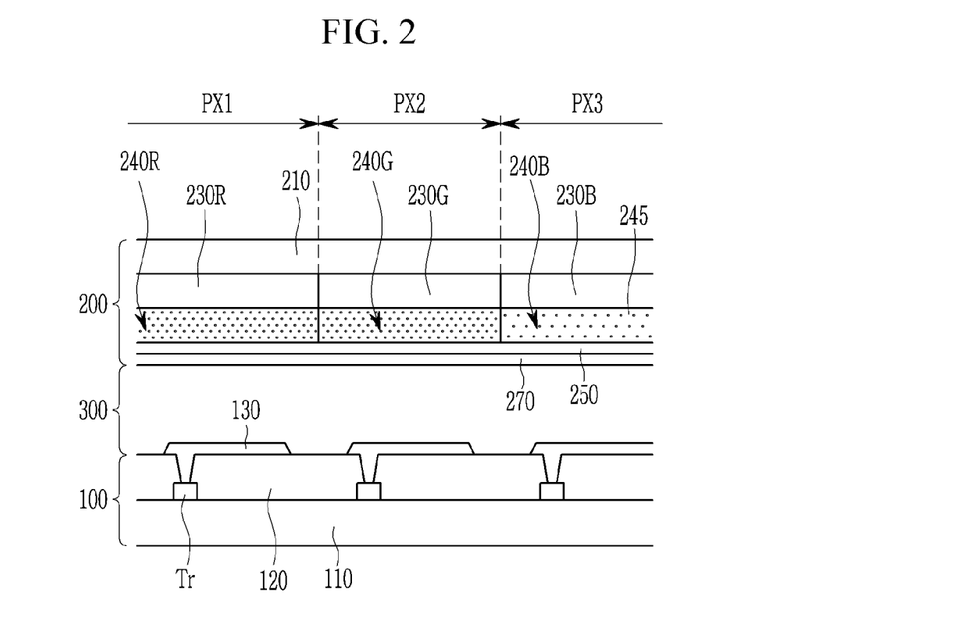

Referring to FIG. 2, the display device is the same that of the display device according to FIG. 1, except for the structure of the red light conversion layer 240R, the green light conversion layer 240G, and the blue light conversion layer 240B. Therefore, the description of the same structures is omitted.

Thicknesses of the red light conversion layer 240R, the green light conversion layer 240G, and the blue light conversion layer 240B may be the same, and the amount of the quantum dot 245 included in the red light conversion layer 240R, the green light conversion layer 240G, and the blue light conversion layer 240B may be different. In an exemplary embodiment, for example, as shown in FIG. 2, the amount of the quantum dot 245 included in the red light conversion layer 240R and the amount of the quantum dot 245 included in the green light conversion layer 240G may be larger than the amount of the quantum dot 245 included in the blue light conversion layer 240B. The amount of the quantum dot 245 included in the red light conversion layer 240R and the amount of the quantum dot 245 included in the green light conversion layer 240G may be the same. Therefore, a defect of the first pixel PX1 due to a defect of the red color filter 230R may be minimized by the red light conversion layer 240R, and a defect of the second pixel PX2 due to the green color filter 230G may be minimized by the green light conversion layer 240G. That is, the red light conversion layer 240R and the green light conversion layer 240G may reduce or effectively prevent smearing at each of the first pixel PX1 and the second pixel PX2 or minimize the color difference at each of the first pixel PX1 and the second pixel PX2.

Where FIG. 2 shows the amount of the quantum dot 245 included in the red light conversion layer 240R and the amount of the quantum dot 245 included in the green light conversion layer 240G is larger than the amount of the quantum dot 245 included in the blue light conversion layer 240B a display device is not limited thereto. In an exemplary embodiment, the amount of the quantum dot 245 included in the green light conversion layer 240G and the amount of the quantum dot 245 included in the blue light conversion layer 240B may be larger than the amount of the quantum dot 245 included in the red light conversion layer 240R. That is, the smearing at each of the second pixel PX2 and the third pixel PX3 may be reduced or effectively prevented or the color difference at each of the second pixel PX2 and the third pixel PX3 may be minimized.

In an exemplary embodiment, the amount of the quantum dot 245 included in the red light conversion layer 240R and the amount of the quantum dot 245 included in the blue light conversion layer 240B may be larger than the amount of the quantum dot 245 included in the green light conversion layer 240G. That is, the smearing at the first pixel PX1 and the third pixel PX3 may be reduced or effectively prevented or the color difference at the first pixel PX1 and the third pixel PX3 may be minimized.

The larger amounts of the quantum dot 245 described above for the respective light conversion layers among the red light conversion layer 240R, the green light conversion layer 240G, and the blue light conversion layer 240B, may be the maximum amount of the quantum dot 245 among the red light conversion layer 240R, the green light conversion layer 240G, and the blue light conversion layer 240B. In FIG. 2, more than one color pixel among the first pixel PX1, the second pixel PX2, and the third pixel PX3 may have the maximum amount of the quantum dot 245.

Figure 3:
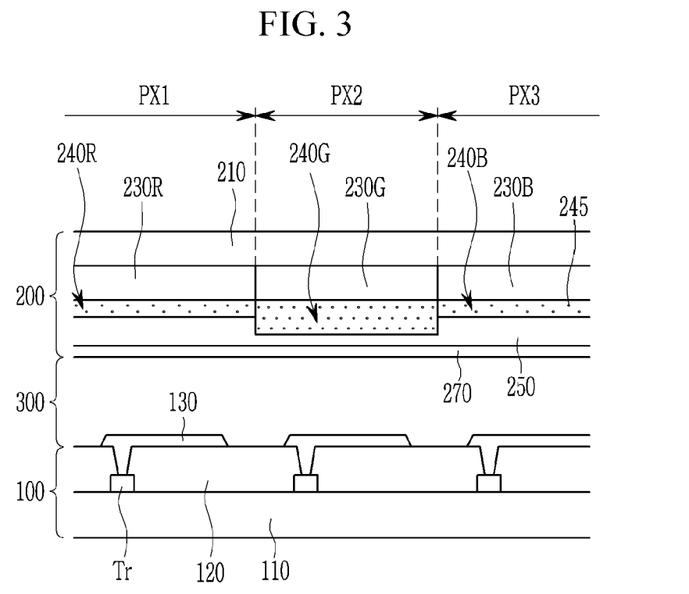

Referring to FIG. 3, the display device is the same as the display device according to FIG. 1 except for the structure of the red light conversion layer 240R, the green light conversion layer 240G, the blue light conversion layer 240B, and the barrier layer 250. Therefore, the description of the same structures is omitted.

Thicknesses of the red light conversion layer 240R, the green light conversion layer 240G, and the blue light conversion layer 240B may be different. In an embodiment, for example, as shown in FIG. 3, the thickness of the green light conversion layer 240G may be greater than each of the thicknesses of the red light conversion layer 240R and the blue light conversion layer 240B. The thicknesses of the red light conversion layer 240R and the blue light conversion layer 240B may be the same. Accordingly, the thickness of the barrier layer 250 corresponding to the red light conversion layer 240R and the blue light conversion layer 240B may be greater than the thickness of the barrier layer 250 corresponding to the green light conversion layer 240G.

A relative thickness of the red light conversion layer 240R, the green light conversion layer 240G, the blue light conversion layer 240B may define a relative amount of the quantum dot 245 include therein. As the thickness of the green light conversion layer 240G is greater than the thicknesses of the red light conversion layer 240R and the blue light conversion layer 240B, the amount of the quantum dot 245 included in the green light conversion layer 240G becomes larger than the amount of the quantum dot 245 included in the red light conversion layer 240R and the amount of the quantum dot 245 in the blue light conversion layer 240B. Accordingly, a defect of the second pixel PX2 due to a defect of the green color filter 230G may be minimized by the green light conversion layer 240G. In other words, the green light conversion layer 240G may reduce or effectively prevent the smearing at the second pixel PX2 or minimize the color difference at the second pixel PX2.

Where FIG. 3 shows the thickness of the green light conversion layer 240G is greater than each of the thicknesses of the red light conversion layer 240R and the blue light conversion layer 240B, a display device is not limited thereto. In an exemplary embodiment, the thickness of the red light conversion layer 240R may be greater than each of the thicknesses of the green light conversion layer 240G and the blue light conversion layer 240B. That is, the smearing at the first pixel PX1 may be reduced or effectively prevented or the color difference at the first pixel PX1 may be minimized.

In an exemplary embodiment, the thickness of the blue light conversion layer 240B may be greater than each of the thicknesses of the red light conversion layer 240R and the green light conversion layer 240G. That is, the smearing at the third pixel PX3 may be reduced or effectively prevented or the color difference at the third pixel PX3 may be minimized. The greater thickness described above for a respective light conversion layer among the red light conversion layer 240R, the green light conversion layer 240G, and the blue light conversion layer 240B, may be the maximum thickness among the red light conversion layer 240R, the green light conversion layer 240G, and the blue light conversion layer 240B. In FIG. 3, one color pixel among the first pixel PX1, the second pixel PX2, and the third pixel PX3 may have the maximum thickness.

Figure 4:
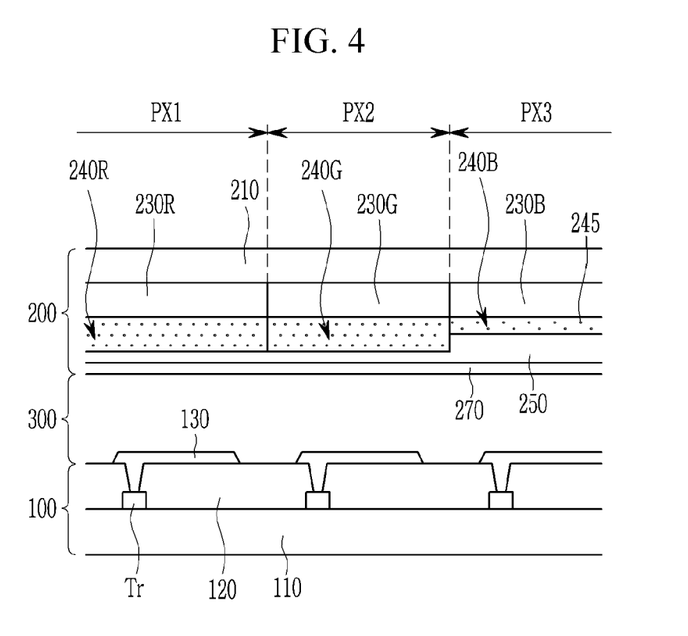

Referring to FIG. 4, the display device is the same as the display device according to FIG. 1, except for the structure of the red light conversion layer 240R, the green light conversion layer 240G, the blue light conversion layer 240B, and the barrier layer 250. Therefore, the description of the same structure is omitted.

Thicknesses of the red light conversion layer 240R, the green light conversion layer 240G, and the blue light conversion layer 240B may be different. In an exemplary embodiment, for example, as shown in FIG. 4, each of the thicknesses of the red light conversion layer 240R and the green light conversion layer 240G may be greater than the thickness of the blue light conversion layer 240B. The thicknesses of the red light conversion layer 240R and the green light conversion layer 240G may be the same. Accordingly, the thickness of the barrier layer 250 corresponding to the blue light conversion layer 240B may be greater than the thickness of the barrier layer 250 corresponding to the red light conversion layer 240R and the green light conversion layer 240G.

As the thicknesses of the red light conversion layer 240R and the green light conversion layer 240G is greater than the thickness of the blue light conversion layer 240B, the amount of the quantum dot 245 included in the red light conversion layer 240R and the green light conversion layer 240G becomes larger than the amount of the quantum dot 245 included in the blue light conversion layer 240B. Accordingly, a defect at the first pixel PX1 due to a defect of the red color filter 230R may be minimized by the red light conversion layer 240R, and a defect at the second pixel PX2 due to a defect of the green color filter 230G may be minimized by the green light conversion layer 240G. That is, the red light conversion layer 240R and the green light conversion layer 240G may reduce or effectively prevent the smearing at the first pixel PX1 and the second pixel PX2 or minimize the color difference at the first pixel PX1 and the second pixel PX2.

Where FIG. 4 shows each of the thicknesses of the red light conversion layer 240R and the green light conversion layer 240G may be greater than the thickness of the blue light conversion layer 240B, a display device is not limited thereto. In an exemplary embodiment, each of the thicknesses of the green light conversion layer 240G and the blue light conversion layer 240B may be greater than the thickness of the red light conversion layer 240R. That is, the smearing at the second pixel PX2 and the third pixel PX3 may be reduced or effectively prevented and the color difference at the second pixel PX2 and the third pixel PX3 may be minimized.

In an exemplary embodiment, each of the thicknesses of the red light conversion layer 240R and the blue light conversion layer 240B may be greater than the thickness of the green light conversion layer 240G. That is, the smearing at the first pixel PX1 and the third pixel PX3 may be reduced or effectively prevented or the color difference at the first pixel PX1 and the third pixel PX3 may be minimized.

The greater thickness described above for respective light conversion layers among the red light conversion layer 240R, the green light conversion layer 240G, and the blue light conversion layer 240B, may be the maximum thickness among the red light conversion layer 240R, the green light conversion layer 240G, and the blue light conversion layer 240B. In FIG. 4, more than one color pixel among the first pixel PX1, the second pixel PX2, and the third pixel PX3 may have the maximum thickness.

Figure 5:
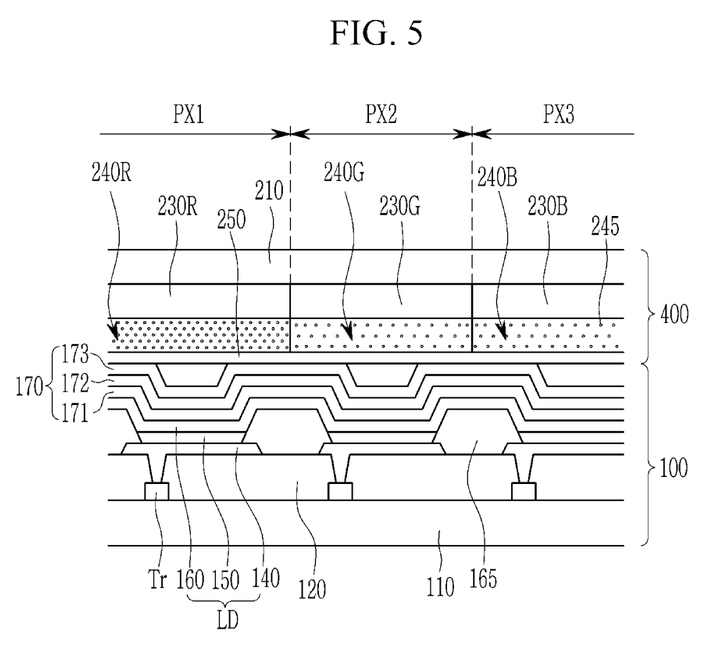

Referring to FIG. 5, the emissive display device includes the first pixel PX1, the second pixel PX2, and the third pixel PX3. The first pixel PX1, the second pixel PX2, and the third pixel PX3 display different colors, respectively. In an exemplary embodiment, for example, the first pixel PX1 may represent red, the second pixel PX2 may represent green, and the third pixel PX3 may represent blue.

Also, the display device includes a first substrate 110, a transistor Tr, an insulating layer 120, a light emitting diode ("LED") LD, a pixel definition layer 165, an encapsulation layer 170, and a color conversion display panel 400. One or more of these elements may be provided in plural within the first display panel 100.

The first substrate 110 includes glass or plastic. The transistor Tr is disposed on the first substrate 110, and the insulating layer 120 is disposed on the transistor Tr and the first substrate 110. The light emitting diode ("LED") LD is disposed on the insulating layer 120 and is connected to the transistor Tr.

The light emitting diode ("LED") LD includes a first electrode 140 connected to the transistor Tr, a light emission member 150 disposed on the first electrode 140, and a second electrode 160 disposed on the light emission member 150. Here, the first electrode 140 may be an anode of the light emitting diode ("LED") LD, and the second electrode 160 may be a cathode of the light emitting diode ("LED") LD. The first electrode 140 includes a conductive material which reflects light, and the second electrode 160 may include a transparent conductive material such as indium tin oxide ("ITO"), indium zinc oxide ("IZO"), and the like. Therefore, light emitted from the light emission member 150 is emitted in direction of the second electrode 160 from the first electrode 140.

The pixel definition layer 165 is disposed on the insulating layer 120 and the first electrode 140. The pixel definition layer 165 defines an opening therein which overlaps the first electrode 140. The opening may define a light emission area within a respective one of the first pixel PX1, the second pixel PX2, and the third pixel PX3. In the opening of the pixel definition layer 165, the first electrode 140 is exposed from the pixel definition layer 165, the light emission member 150 is disposed on the first electrode 140 and the second electrode 160 is disposed on the light emission member 150.

The encapsulation layer 170 is disposed on the second electrode 160 and protects the light emitting diode ("LED") LD from elements such as moisture and oxygen. The encapsulation layer 170 includes a first inorganic layer 171 disposed on the second electrode 160, an organic layer 172 disposed on the first inorganic layer 171, and a second inorganic layer 173 disposed on the organic layer 172. Alternatively, the encapsulation layer 170 may be a multi-layer structure having four or more layers in which the inorganic layer and the organic layer are repeatedly stacked.

The first pixel PX1, the second pixel PX2, and the third pixel PX3 each include the transistor Tr, the light emitting diode ("LED") LD, a portion of the pixel definition layer 165, and a portion of the encapsulation layer 170.

The color conversion display panel 400 is disposed on the encapsulation layer 170. The color conversion display panel 400 includes the second substrate 210, the red color filter 230R, the green color filter 230G, the blue color filter 230B, the red light conversion layer 240R, the green light conversion layer 240G, the blue light conversion layer 240B, and the barrier layer 250. The red color filter 230R, the green color filter 230G, the blue color filter 230B, the red light conversion layer 240R, the green light conversion layer 240G, the blue light conversion layer 240B, and the barrier layer 250 are disposed between the second substrate 210 and the encapsulation layer 170. The barrier layer 250 is disposed on the encapsulation layer 170. The barrier layer 250 and the encapsulation layer 170 may be adhered to each other by an adhesive layer (not shown).

The first pixel PX1 may include the red color filter 230R and the red light conversion layer 240R, the second pixel PX2 may include the green color filter 230G and the green light conversion layer 240G, and the third pixel PX3 may include the blue color filter 230B and the blue light conversion layer 240B. Also, the first pixel PX1, the second pixel PX2, and the third pixel PX3 each include a portion of the barrier layer 250.

The structure of the color conversion display panel 400 is the same as the structure in which the common electrode 270 is omitted in the second display panel 200 of the liquid crystal display as the display device according to FIG. 1. That is, the red light conversion layer 240R, the green light conversion layer 240G, and the blue light conversion layer 240B are respectively disposed at a surface of the red color filter 230R, the green color filter 230G, and the blue color filter 230B. That is, along a thickness of the display device, the red light conversion layer 240R overlaps the red color filter 230R, the green light conversion layer 240G overlaps the green color filter 230G, and the blue light conversion layer 240B overlaps the blue color filter 230B.

The red light conversion layer 240R converts light supplied from the light emitting diode ("LED") LD into the red light to be emitted from the red light conversion layer 240R, and the green light conversion layer 240G converts light supplied from the light emitting diode ("LED") LD into the green light to be emitted from the green light conversion layer 240G. The blue light conversion layer 240B converts light supplied from the light emitting diode ("LED") LD into the blue light to be emitted from the blue light conversion layer 240B.

The red light conversion layer 240R, the green light conversion layer 240G, and the blue light conversion layer 240B include a quantum dot 245 provided in plurality. The quantum dot 245 may be selected from a Group II-VI compound, a Group III-V compound, a Group IV-VI compound, a Group IV element, a Group IV compound, and a combination thereof.

The thicknesses of the red light conversion layer 240R, the green light conversion layer 240G, and the blue light conversion layer 240B may be the same, and the amount of the quantum dot 245 included in the red light conversion layer 240R, the green light conversion layer 240G, and the blue light conversion layer 240B may be different. In an exemplary embodiment, for example, as shown in FIG. 5, the amount of the quantum dot 245 included in the red light conversion layer 240R may be larger than each of the amount of the quantum dot 245 included in the green light conversion layer 240G and the amount of the quantum dot 245 included in the blue light conversion layer 240B. The amount of the quantum dot 245 included in the green light conversion layer 240G and the blue light conversion layer 240B may be the same. Accordingly, a defect of the first pixel PX1 due to a defective red color filter 230R may be minimized by the red light conversion layer 240R. That is, the red light conversion layer 240R may reduce or effectively prevent smearing at the first pixel PX1 or minimize the color difference at the first pixel PX1.

Where FIG. 5 shows the amount of the quantum dot 245 included in the red light conversion layer 240R may be larger than the amount of the quantum dot 245 included in the green light conversion layer 240G and the amount of the quantum dot 245 included in the blue light conversion layer 240B, a display device is not limited thereto. In an exemplary embodiment, the amount of the quantum dot 245 included in the green light conversion layer 240G may be larger than the amount of the quantum dot 245 included in the red light conversion layer 240R and the amount of the quantum dot 245 included in the blue light conversion layer 240B. That is, the smearing at the second pixel PX2 may be reduced or effectively prevented or the color difference at the second pixel PX2 may be minimized.

In an exemplary embodiment, the amount of the quantum dot 245 included in the blue light conversion layer 240B may be larger than the amount of the quantum dos 245 included in the red light conversion layer 240R and the amount of the quantum dot 245 included in the green light conversion layer 240G. That is, the smearing at the third pixel PX3 may be reduced or effectively prevented or the color difference at the third pixel PX3 may be minimized.

Figure 6:
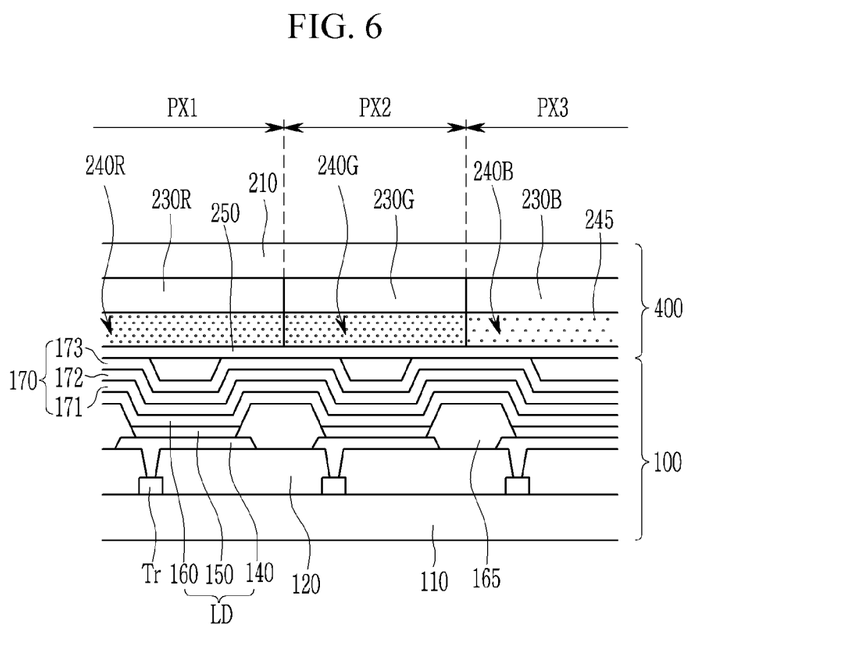

Referring to FIG. 6, the display device is the same as the display device according to FIG. 5 except for the structure of the red light conversion layer 240R, the green light conversion layer 240G, and the blue light conversion layer 240B. Therefore, the description of the same structures is omitted.

The thicknesses of the red light conversion layer 240R, the green light conversion layer 240G, and the blue light conversion layer 240B may be the same, and the amount of the quantum dot 245 included in the red light conversion layer 240R, the green light conversion layer 240G, and the blue light conversion layer 240B may be different. In an exemplary embodiment, for example, as shown in FIG. 6, the amount of the quantum dot 245 included in each of the red light conversion layer 240R and the green light conversion layer 240G may be larger than the amount of the quantum dot 245 included in the blue light conversion layer 240B. The amount of the quantum dot 245 included in the red light conversion layer 240R and the green light conversion layer 240G may be the same. Therefore, a defect of the first pixel PX1 due to a defect of the red color filter 230R may be minimized by the red light conversion layer 240R, and a defect of the second pixel PX2 due to the green color filter 230G may be minimized by the green light conversion layer 240G. That is, the red light conversion layer 240R and the green light conversion layer 240G may reduce or effectively prevent smearing at the first pixel PX1 and the second pixel PX2 or minimize the color difference at the first pixel PX1 and the second pixel PX2.

Where FIG. 6 shows the amount of the quantum dot 245 included in each of the red light conversion layer 240R and the green light conversion layer 240G is larger than the amount of the quantum dot 245 included in the blue light conversion layer 240B, a display device is not limited thereto. The amount of the quantum dot 245 included each of in the green light conversion layer 240G and the blue light conversion layer 240B may be larger than the amount of the quantum dot 245 included in the red light conversion layer 240R. That is, the smearing at the second pixel PX2 and the third pixel PX3 may be reduced or effectively prevented or the color difference at the second pixel PX2 and the third pixel PX3 may be minimized.

In an exemplary embodiment, the amount of the quantum dot 245 included in each of the red light conversion layer 240R and the blue light conversion layer 240B may be larger than the amount of the quantum dot 245 included in the green light conversion layer 240G. That is, the smearing at the first pixel PX1 and the third pixel PX3 may be reduced or effectively prevented or the color difference at the first pixel PX1 and the third pixel PX3 may be minimized.

Figure 7:
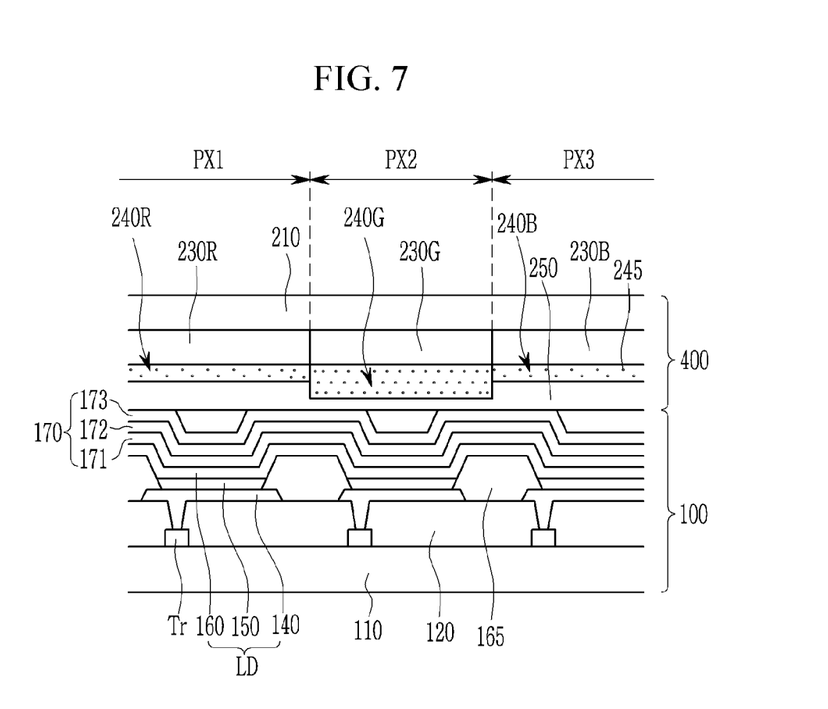

Referring to FIG. 7, the display device is the same as the display device according to FIG. 5, except for the structure of the red light conversion layer 240R, the green light conversion layer 240G, the blue light conversion layer 240B, and the barrier layer 250. Therefore, the description of the same structures is omitted.

Thicknesses of the red light conversion layer 240R, the green light conversion layer 240G, and the blue light conversion layer 240B may be different. In an exemplary embodiment, for example, as shown in FIG. 7, the thickness of the green light conversion layer 240G may be greater than each of the thicknesses of the red light conversion layer 240R and the blue light conversion layer 240B. The thicknesses of the red light conversion layer 240R and the blue light conversion layer 240B may be the same. Accordingly, each of the thickness of the barrier layer 250 corresponding to the red light conversion layer 240R and the blue light conversion layer 240B may be greater than the thickness of the barrier layer 250 corresponding to the green light conversion layer 240G.

As the thickness of the green light conversion layer 240G is greater than each of the thicknesses of the red light conversion layer 240R and the blue light conversion layer 240B, the amount of the quantum dot 245 included in the green light conversion layer 240G becomes larger than the amount of the quantum dot 245 included in each of the red light conversion layer 240R and the blue light conversion layer 240B. Accordingly, a defect of the second pixel PX2 due to a defect of the green color filter 230G may be minimized by the green light conversion layer 240G. In other words, the green light conversion layer 240G may reduce or effectively prevent smearing at the second pixel PX2 or minimize the color difference at the second pixel PX2.

Where FIG. 7 shows the thickness of the green light conversion layer 240G is greater than each of the thicknesses of the red light conversion layer 240R and the blue light conversion layer 240B, a display device is not limited thereto. The thickness of the red light conversion layer 240R may be greater than each of the thicknesses of the green light conversion layer 240G and the blue light conversion layer 240B. That is, the smearing at the first pixel PX1 may be reduced or effectively prevented or the color difference at the first pixel PX1 may be minimized.

In an exemplary embodiment, the thickness of the blue light conversion layer 240B may be greater than each of the thicknesses of the red light conversion layer 240R and the green light conversion layer 240G. That is, the smearing at the third pixel PX3 may be reduced or effectively prevented or the color difference at the third pixel PX3 may be minimized.

Figure 8:
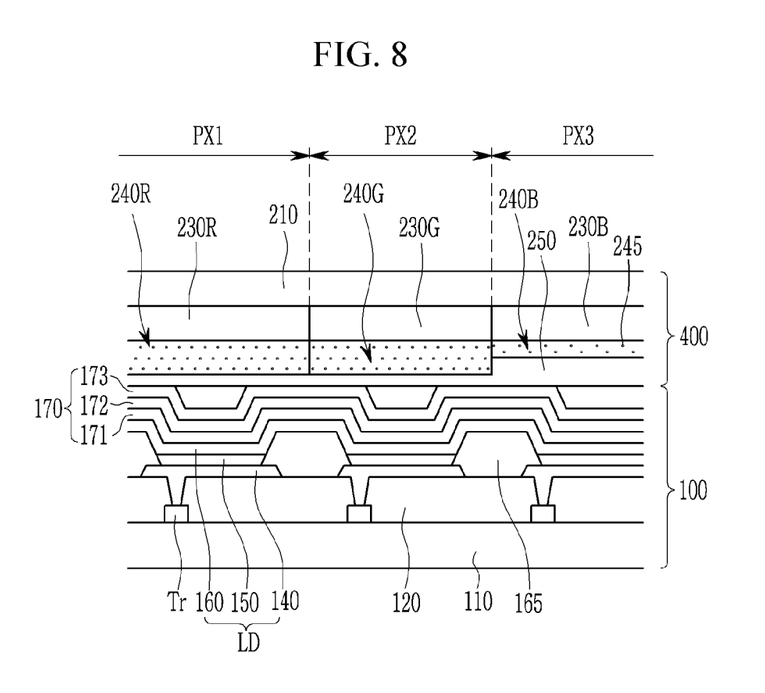

Referring to FIG. 8, the display device is the same as the display device according to FIG. 5, except for the structure of the red light conversion layer 240R, the green light conversion layer 240G, the blue light conversion layer 240B, and the barrier layer 250 rest structure. Therefore, the description of the same structures is omitted.

Thicknesses of the red light conversion layer 240R, the green light conversion layer 240G and the blue light conversion layer 240B may be different. In an exemplary embodiment, for example, as shown in FIG. 8, each of the thicknesses of the red light conversion layer 240R and the green light conversion layer 240G may be greater than the thickness of the blue light conversion layer 240B. That is, the thicknesses of the red light conversion layer 240R and the green light conversion layer 240G may be the same. Accordingly, the thickness of the barrier layer 250 corresponding to the blue light conversion layer 240B may be greater than the thickness of the barrier layer 250 corresponding to each of the red light conversion layer 240R and the green light conversion layer 240G.

As each of the thicknesses of the red light conversion layer 240R and the green light conversion layer 240G are greater than the thickness of the blue light conversion layer 240B, each of the amount of the quantum dot 245 included in the red light conversion layer 240R and the green light conversion layer 240G becomes larger than the amount of the quantum dot 245 included in the blue light conversion layer 240B. Accordingly, a defect of the first pixel PX1 due to a defect of the red color filter 230R may be minimized by the red light conversion layer 240R, and a defect of the second pixel PX2 due to a defect of the green color filter 230G may be minimized by the green light conversion layer 240G. That is, the red light conversion layer 240R and the green light conversion layer 240G may reduce or effectively prevent the smearing at the first pixel PX1 and the second pixel PX2 or minimize the color difference at the first pixel PX1 and the second pixel PX2.

Where FIG. 8 shows each of the thicknesses of the red light conversion layer 240R and the green light conversion layer 240G are greater than the thickness of the blue light conversion layer 240B, a display device is not limited thereto. In an exemplary embodiment, each of the thicknesses of the green light conversion layer 240G and the blue light conversion layer 240B may be greater than the thickness of the red light conversion layer 240R. That is, the smearing at the second of the second pixel PX2 and the third pixel PX3 may be reduced or effectively prevented and the color difference at the second of the second pixel PX2 and the third pixel PX3 may be minimized.

In an exemplary embodiment, each of the thicknesses of the red light conversion layer 240R and the blue light conversion layer 240B may be greater than the thickness of the green light conversion layer 240G. That is, the smearing at the first pixel PX1 and the third pixel PX3 may be reduced or effectively prevented or the color difference at the first pixel PX1 and the third pixel PX3 may be minimized.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A display device comprising:
    a plurality of pixels including a first pixel, a second pixel, and a third pixel from which lights of different colors are respectively emitted;
    a plurality of color filters respectively corresponding to the plurality of pixels; and
    a plurality of light conversion layers each overlapping a color filter among the plurality of color filters, the plurality of light conversion layers including:
        in the first pixel, a first light conversion layer including an amount of a quantum dot which overlaps a first color filter;
        in the second pixel, a second light conversion layer including an amount of a quantum dot which overlaps a second color filter; and
        in the third pixel, a third light conversion layer including an amount of a quantum dot which overlaps a third color filter,
    wherein among the plurality of light conversion layers which each overlaps the color filter among the plurality of color filters:
        the amount of the quantum dot which overlaps the first color filter is larger than each of the amount of the quantum dot which overlaps the second color filter and the amount of the quantum dot which overlaps the third color filter,
        each of the first light conversion layer, the second light conversion layer and the third light conversion layer has a thickness defined from the first color filter, the second color filter and the third color filter, respectively, and
        the thickness of the first light conversion layer is greater than each of the thickness of the second light conversion layer and the thickness of the third light conversion layer.

2. The display device of claim 1, wherein the amount of the quantum dot which overlaps the second color filter and the amount of the quantum dot which overlaps the third color filter are the same.

3. The display device of claim 2, wherein the thickness of the second light conversion layer and the thickness of the third light conversion layer are the same.

4. The display device of claim 3, wherein each of the first pixel, the second pixel, and the third pixel includes:
a transistor;
a pixel electrode connected to the transistor;
a common electrode facing the pixel electrode; and
a liquid crystal layer disposed between the pixel electrode and the common electrode.

5. The display device of claim 3, wherein each of the first pixel, the second pixel, and the third pixel includes:
a transistor;
a light emitting diode connected to the transistor; and
an encapsulation layer on the light emitting diode.

6. A display device comprising:
a plurality of pixels including a first pixel, a second pixel, and a third pixel from which lights of different colors are respectively emitted;
a plurality of color filters respectively corresponding to the plurality of pixels; and
a plurality of light conversion layers each overlapping a color filter among the plurality of color filters, the plurality of light conversion layers including:
in the first pixel, a first light conversion layer including an amount of a quantum dot which overlaps a first color filter;
in the second pixel, a second light conversion layer including an amount of a quantum dot which overlaps a second color filter; and
in the third pixel, a third light conversion layer including an amount of a quantum dot which overlaps a third color filter,
wherein among the plurality of light conversion layers which each overlaps the color filter among the plurality of color filters:
the amount of the quantum dot which overlaps the first color filter and the amount of the quantum dot which overlaps the second color filter are both larger than the amount of the quantum dot which overlaps the third color filter,
each of the first light conversion layer, the second light conversion layer and the third light conversion layer has a thickness defined from the first color filter, the second color filter and the third color filter, respectively, and
the thickness of the first light conversion layer and the thickness of the second light conversion layer are both greater than the thickness of the third light conversion layer.

7. The display device of claim 6, wherein the amount of the quantum dot which overlaps the first color filter and the amount of the quantum dot which overlaps the second color filter are the same.

8. The display device of claim 7, wherein the thickness of the first light conversion layer and the thickness of the second light conversion layer are the same.

9. The display device of claim 8, wherein each of the first pixel, the second pixel, and the third pixel includes:
a transistor;
a pixel electrode connected to the transistor;
a common electrode facing the pixel electrode; and
a liquid crystal layer disposed between the pixel electrode and the common electrode.

10. The display device of claim 8, wherein each of the first pixel, the second pixel, and the third pixel includes:
a transistor;
a light emitting diode connected to the transistor; and
an encapsulation layer on the light emitting diode.

11. A display device comprising:
a first display panel including a transistor and an electrode which is connected to the transistor; and
a second display panel including:
a plurality of light conversion layers each overlapping a color filter among the plurality of color filters;
a first color filter overlapping an amount of a quantum dot included in a first light conversion layer,
a second color filter overlapping an amount of a quantum dot included in a second light conversion layer, and
a third color filter overlapping an amount of a quantum dot included in a third light conversion layer,
wherein among the plurality of light conversion layers which each overlaps the color filter among the plurality of color filters:
the amount of the quantum dot which overlaps the first color filter is larger than the amount of the quantum dot which overlaps the second color filter or the amount of the quantum dot which overlaps the third color filter,
each of the first light conversion layer, the second light conversion layer and the third light conversion layer has a thickness defined from the first color filter, the second color filter and the third color filter, respectively, and
the thickness of the first light conversion layer is greater than each of the thickness of the second light conversion layer and the thickness of the third light conversion layer.

12. The display device of claim 11, wherein
the amount of the quantum dot which overlaps the second color filter and the amount of the quantum dot which overlaps the third color filter are the same, and
the thickness of the second light conversion layer and the thickness of the third light conversion layer are the same.

13. The display device of claim 11, further comprising:
a liquid crystal layer disposed between the first display panel and the second display panel.

14. The display device of claim 11, further comprising:
a light emitting diode connected to the transistor, the light emitting diode including the electrode;
an encapsulation layer disposed on the light emitting diode; and
the second display panel disposed on the encapsulation layer.

* * * * *